United States Patent
Kawamura (10) Patent No.: US 11,740,110 B2
(45) Date of Patent: Aug. 29, 2023

(54) SENSOR-DEVICE ATTACHMENT STRUCTURE

(71) Applicant: DENSO WAVE INCORPORATED, Chita-gun (JP)

(72) Inventor: Tomohiro Kawamura, Chita-gun (JP)

(73) Assignee: DENSO WAVE INCORPORATED, Aichi-Pref. (JP)

( * ) Notice: Subject to any disclaimer, the term of this patent is extended or adjusted under 35 U.S.C. 154(b) by 0 days.

(21) Appl. No.: 17/880,260

(22) Filed: Aug. 3, 2022

(65) Prior Publication Data

US 2023/0080689 A1    Mar. 16, 2023

(30) Foreign Application Priority Data

Sep. 10, 2021    (JP) .................................. 2021-147920

(51) Int. Cl.
*G01D 11/30*    (2006.01)
(52) U.S. Cl.
CPC ..................................... *G01D 11/30* (2013.01)
(58) Field of Classification Search
CPC ..................................................... G01D 11/30
See application file for complete search history.

(56) References Cited

U.S. PATENT DOCUMENTS

2009/0165557 A1*    7/2009    Ueda ................... G01C 19/5607
                                                                    73/504.16
2017/0115453 A1*    4/2017    Shishido ............... G02B 6/428

FOREIGN PATENT DOCUMENTS

JP    H06-186104 A         7/1994
JP    2020155537 A    *    9/2020

* cited by examiner

*Primary Examiner* — Jamel E Williams
(74) *Attorney, Agent, or Firm* — Oliff PLC (57) ABSTRACT

Provided is a sensor-device attachment structure including: a thin portion that is thinner than other parts of a member; a flexible board; an at least one sensor device installed to the flexible board; a spacer that is formed into a shape of a film having a uniform thickness, that is sandwiched between the thin portion and the flexible board, and that includes a through portion which is formed through the spacer in a thickness direction of the spacer at a position corresponding to the at least one sensor device; and an adhesive that is charged in the through portion, and that bonds the thin portion and the flexible board to each other.

7 Claims, 12 Drawing Sheets

SENSOR-DEVICE ATTACHMENT STRUCTURE

CROSS-REFERENCE TO RELATED APPLICATION

This application is based on and claims the benefit of priority from earlier Japanese Patent Application No. 2021-147920 filed Sep. 10, 2021, the description of which is incorporated herein by reference.

BACKGROUND OF THE INVENTION

Technical Field of the Invention

The present disclosure relates to a sensor-device attachment structure in which a sensor device is attached to a member.

Related Art

Hitherto, there has been a structure obtained by forming a protruding portion on a bottom surface of a recessed part formed in a case, charging an adhesive into the recessed part, placing a glass base coupled to a sensor device onto the protruding portion, pressing the glass base from above, and curing the adhesive to fix the glass base (refer to Japanese Patent Application Laid-open No. H6-186104). According to Japanese Patent Application Laid-open No. H6-186104, the glass base is supported in a horizontal posture with its bottom surface partially overlapping with the protruding portion, and the adhesive is charged without gaps between the bottom surface of the glass base and the bottom surface of the recessed part in surface areas out of the protruding portion.

SUMMARY

In this context, in attaching a sensor device installed on a flexible board to a thin portion of a member, it is difficult to form the protruding portion on the flexible board or the thin portion because the flexible board and the thin portion are thin. Even when the protruding portion can be formed, it is also difficult to secure dimensional accuracy of the protruding portion. Thus, the structure disclosed in Japanese Patent Application Laid-open No. H6-186104 cannot be employed, and hence it is difficult to secure a thickness of an adhesive for attaching the sensor device due to the protruding portion.

The present disclosure has been made to solve problems as described above, and a main object thereof is to secure a thickness of an adhesive in a sensor-device attachment structure in which a sensor device installed on a flexible board is attached to a thin portion of a member.

According to an embodiment of the present disclosure, there is provided a sensor-device attachment structure including:
a thin portion that is thinner than other parts of a member;
a flexible board;
an at least one sensor device installed to the flexible board;
a spacer that
is formed into a shape of a film having a uniform thickness,
is sandwiched between the thin portion and the flexible board, and
includes a through portion which is formed through the spacer in a thickness direction of the spacer at a position corresponding to the at least one sensor device; and
an adhesive
is charged in the through portion, and
bonds the thin portion and the flexible board to each other.

In the above-described configuration, the at least one sensor device is installed to the flexible board. The spacer is formed into the shape of the film having the uniform thickness, and is sandwiched between the thin portion and the flexible board. Thus, under a state in which the flexible board is pressed against the thin portion through intermediation of the spacer, a distance between the thin portion and the flexible board is equal to the thickness of the spacer. Thus, this distance can be adjusted by adjusting the thickness of the spacer.

In addition, the through portion is formed through the spacer in the thickness direction of the spacer at the position corresponding to the at least one sensor device. In this context, the adhesive, which is charged in the through portion, bonds the thin portion and the flexible board to each other. Thus, by injecting the adhesive into the through portion, and then by pressing the flexible board against the thin portion through intermediation of the spacer, a thickness of the adhesive is equal to the thickness of the spacer. In other words, the thickness of the adhesive can be secured owing to the thickness of the spacer. Thus, the thickness of the adhesive can be secured also when the at least one sensor device installed to the flexible board is attached to the thin portion of the member.

Further, the spacer may include another through portion which is formed through the spacer in the thickness direction of the spacer at a position out of correspondence to the at least one sensor device. With such a configuration, when a part out of correspondence to the at least one sensor device among parts of the flexible board is also bonded to the thin portion, the thickness of the adhesive can be secured also at this out-of-correspondence part.

Still further, the thin portion may be formed into an annular shape, and
the flexible board and the spacer may be formed annularly along the thin portion. With such a configuration, the thickness of the adhesive can be secured at a bonding part when the flexible board is bonded in conformity to the shape of the thin portion.

Yet further, in the spacer, a shape and a size of the through portion which is formed at the position corresponding to the at least one sensor device, and a shape and a size of the other through portion which is formed at the position out of correspondence to the at least one sensor device may be the same as each other. In such a configuration, in the spacer, the through portions having the same shape and the same size are formed both at the position corresponding to the at least one sensor device and the position out of correspondence to the at least one sensor device. Thus, the through portions can be easily formed (that is, manufactured), and the shapes and the sizes of the through portions can be easily managed.

Yet further, the at least one sensor device may be formed as an electronic-circuit pattern on the flexible board. With such a configuration, bonding or soldering of the at least one sensor device to the flexible board can be omitted. Thus, the at least one sensor device can be easily installed to the flexible board.

Yet further, the at least one sensor device may include a plurality of sensor devices, and the through portion of the spacer may include a plurality of through portions which are formed through the spacer in the thickness direction of the spacer at positions corresponding respectively to the plurality of sensor devices. With such a configuration, the thickness of the adhesive can be secured in all of corresponding ones of the plurality of through portions when the plurality of sensor devices are attached to the thin portion.

Yet further, the through portion may communicate to an outside of the spacer. With such a configuration, a surplus of the adhesive can be extruded through a part communicating to the outside of the spacer among parts of the through portion.

DETAILED DESCRIPTION OF THE PREFERRED EMBODIMENTS

Hereinbelow, a first embodiment in which a sensor-device attachment structure for attaching a sensor device to strain wave gearing provided to a joint of a robot is embodied is described with reference to the drawings.

Figure 1:
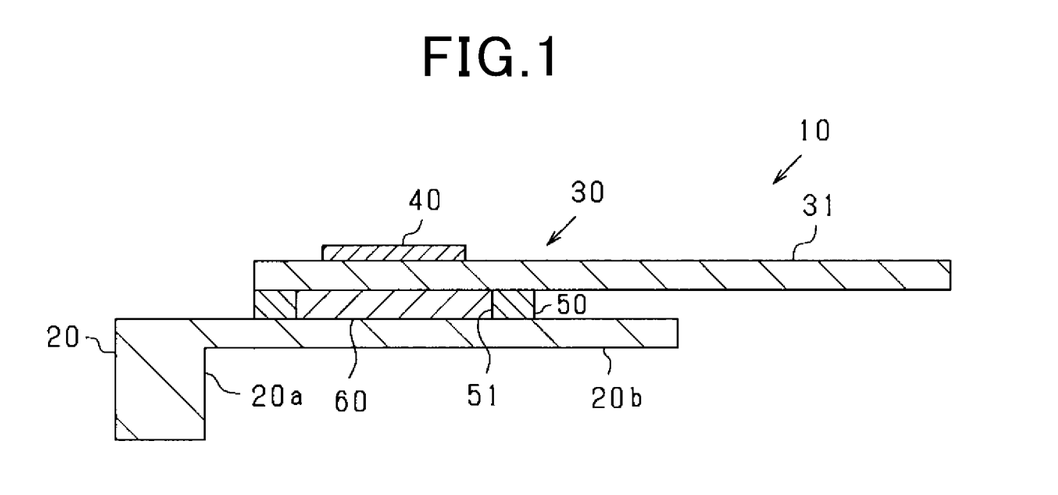
FIG. 1 is a cross-sectional view of a sensor-device attachment structure.

As illustrated in FIG. 1, a sensor-device attachment structure 10 includes a member 20, a flexible-board assembly 30, and an adhesive 60.

The member 20 is, for example, a flexible gear, a coupling member, or a housing to be included in the strain wave gearing (a speed reducer), and includes a thick portion 20a and a thin portion 20b.

Figure 2:
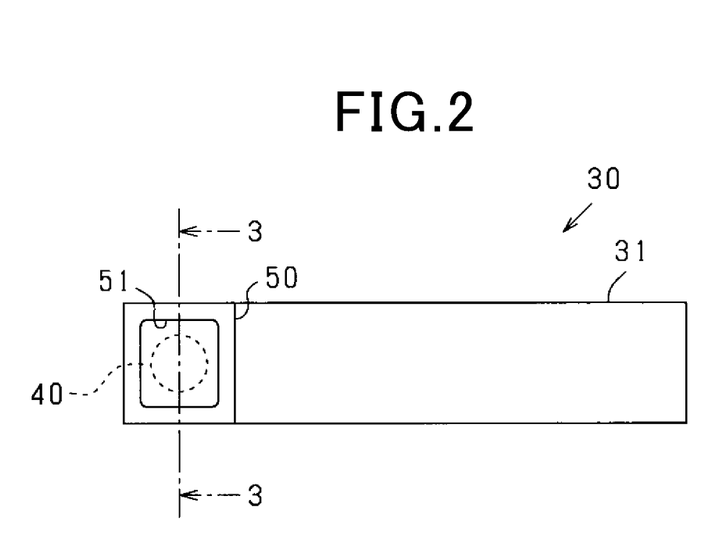
FIG. 2 is a bottom view of a flexible-board assembly.
Figure 3:
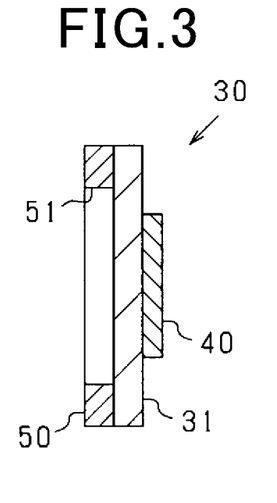
FIG. 3 is a cross-sectional view as viewed from a direction indicated by arrows 3-3 in FIG. 2.

As illustrated in FIG. 1 to FIG. 3, the flexible-board assembly 30 includes a flexible board 31, a sensor device 40, and a spacer 50.

The flexible board 31 is a well-known FPC (Flexible Printed Circuit). For example, the flexible board 31 is formed by forming an adhesive layer over a base film being a thin-film-like insulator, by applying a conductor pattern (such as a conductive foil) onto the adhesive layer, and by covering parts other than terminal portions and soldering portions with an insulating coverlay made of polyimide or the like. A thickness of the flexible board 31 is, for example, 0.1 [mm] to 0.5 [mm].

The sensor device 40 is a sensor device such as a torque sensor (more specifically, a strain gauge), a vibration sensor, a temperature sensor, a pressure sensor, or an optical sensor. The sensor device 40 includes a device portion and a lead (such as a conductive wire) running from the device portion, and this lead is soldered (for example, surface-mounted) to the soldering portion of the flexible board 31. In other words, the sensor device 40 is installed on the flexible board 31. Although a shape of the sensor device 40 is herein illustrated as a disc shape, the sensor device 40 may be formed into arbitrary shapes.

The spacer 50 is obtained by forming, for example, polyimide or an insulating resin such as a fluorine resin into a shape of a film having a uniform thickness. The thickness of the spacer 50 ranges, for example, from 0.05 [mm] to 0.2 [mm] in accordance with a type of the sensor device 40 and a thickness to be adjusted of the adhesive 60. The spacer 50 is applied to one surface on a side opposite to a side where another surface to which the sensor device 40 is attached among surfaces of the flexible board 31 is present. Under a state in which the flexible-board assembly 30 is attached to the thin portion 20b of the member 20, the spacer 50 is sandwiched between the thin portion 20b and the flexible board 31. Note that, when the material of the coverlay of the flexible board 31 and the material of the spacer 50 are the same as each other, the spacer 50 may be formed integrally with the coverlay.

A through-hole 51 is formed through the spacer 50 in its thickness direction. The through-hole 51 (that is, a through portion) is formed to be larger than the sensor device 40, and encompasses the sensor device 40 in a bottom view. In other words, the through-hole 51 is formed at a position corresponding to the sensor device 40 (that is, at a position overlapping with the sensor device 40). Although a shape of the through-hole 51 is herein illustrated as a square shape in its cross-section, the through-hole 51 may be formed into arbitrary shapes. When the through-hole 51 is formed to be larger than the sensor device 40 in such a way, the sensor device 40 is enabled to sense the thin portion 20b only via the adhesive 60 for the spacer 50. Thus, uniformity in sensing can be increased to be higher than that in performing sensing via a plurality of members, that are made of different materials, for the spacer 50.

The adhesive 60 is, for example, a thermosetting adhesive. The adhesive 60 is charged to fill the through-hole 51 of the spacer 50. The adhesive 60 is cured by heating to bond the thin portion 20b of the member 20 and the flexible board 31 to each other. Note that, the adhesive 60 may be, for example, a normal-temperature curing adhesive or a two-component adhesive.

Next, a procedure for attaching the sensor device 40 to the thin portion 20b of the member 20 (a manufacturing method for the sensor-device attachment structure) is described. The following procedure may be performed by an operator, or may be performed by a production machine such as a robot.

First, the flexible board 31 on which a predetermined conductor pattern has been formed is prepared.

Then, the lead of the sensor device 40 is soldered to the soldering portion of the flexible board 31. In other words, the sensor device 40 is mounted (that is, attached) to an upper surface (also referred to as a "first surface") of the flexible board 31.

Next, the spacer 50 is applied (that is, firmly fitted or bonded) to a lower surface of the flexible board 31 (also referred to as a "second surface" on the side opposite to the side where the first surface is present). At this time, the spacer 50 is positioned relative to the flexible board 31 such that a center of the through-hole 51 of the spacer 50 and a center of the sensor device 40 are aligned with each other in the bottom view. In this way, the flexible-board assembly 30 is completed.

After that, the adhesive 60 is injected into the through-hole 51. At this time, the through-hole 51 is filled with the adhesive 60 such that voids are not formed.

Then, the spacer 50 is pressed against the thin portion 20b of the member 20, specifically, at a position where the flexible-board assembly 30 is attached. In other words, the flexible board 31 is pressed against the thin portion 20b through intermediation of the spacer 50. In this state, the thickness of the adhesive 60 is equal to the thickness of the spacer 50. At this time, a surplus of the adhesive 60 may be extruded from the through-hole 51.

Next, the member 20 and the flexible-board assembly 30 are heated to cure the adhesive 60. In this way, the sensor-device attachment structure 10 is completed (that is, manufactured).

The embodiment described above in detail provides the following advantages.

The sensor device 40 is installed on the flexible board 31. The spacer 50 is formed into the shape of the film having the uniform thickness, and is sandwiched between the thin portion 20b and the flexible board 31. Thus, under the state in which the flexible board 31 is pressed against the thin portion 20b through intermediation of the spacer 50, a distance between the thin portion 20b and the flexible board 31 is equal to the thickness of the spacer 50. Thus, this distance can be adjusted by adjusting the thickness of the spacer 50.

The through-hole 51 is formed through the spacer 50 in its thickness direction at the position overlapping with the sensor device 40. In addition, the adhesive 60, which is charged in the through-hole 51, bonds the thin portion 20b and the flexible board 31 to each other. Thus, by injecting the adhesive 60 into the through-hole 51, and then by pressing the flexible board 31 against the thin portion 20b through intermediation of the spacer 50, the thickness of the adhesive 60 is equal to the thickness of the spacer 50. In other words, the thickness of the adhesive 60 can be secured owing to the thickness of the spacer 50. Thus, the thickness of the adhesive 60 can be secured also when the sensor device 40 installed on the flexible board 31 is attached to the thin portion 20b of the member 20. Further, it is easy to equalize the thickness of the film-like spacer 50, and hence the thickness of the adhesive 60 can be stabilized also in mass-produced products. Still further, it is easy to properly manage bonding strength and a distance between the thin portion 20b and the sensor device 40.

Note that, the above-described embodiment may be modified as follows. Parts that are same as those in the above-described embodiment are denoted by the same reference symbols to omit redundant description thereof.

Figure 4:
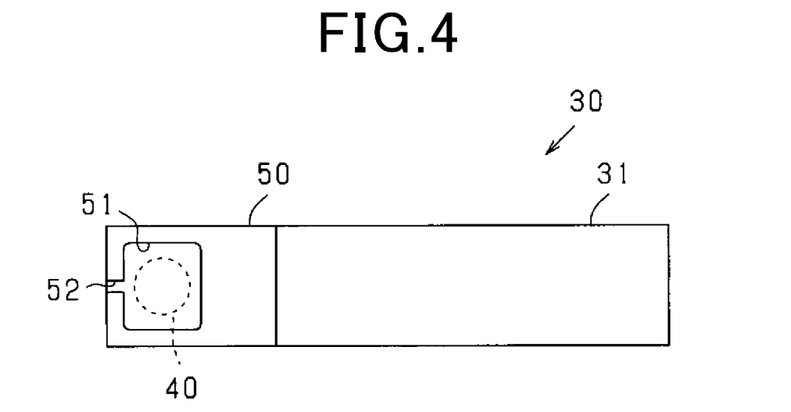
FIG. 4 is a bottom view illustrating a modification of the flexible-board assembly.

As illustrated in FIG. 4, a groove 52 that communicates an outside of the spacer 50 and the through-hole 51 to each other may be formed in the spacer 50. With such a configuration, even when the adhesive 60 is injected by a large amount into the through-hole 51, the surplus of the adhesive 60 can be extruded through the groove 52 when the spacer 50 is pressed against the thin portion 20b. Note that, a width of the groove 52 is smaller than a width of the through-hole 51, and hence the adhesive 60, which is viscous, remains unlikely to be extruded into the groove 52 until filling an inside of the through-hole 51. Thus, the inside of the through-hole 51 is easily filled with the adhesive 60, and the adhesive 60 is unlikely to be left in a direction of the thickness of the spacer 50. As a result, the thickness of the adhesive 60 can be further stabilized.

Figure 5:
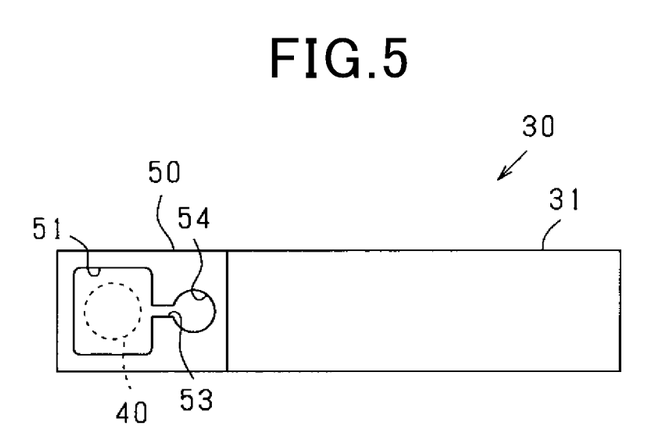
FIG. 5 is a bottom view illustrating another modification of the flexible-board assembly.

As illustrated in FIG. 5, an adhesive pool 54 being a through-hole that does not communicate to the outside may be formed in the spacer 50, and the through-hole 51 and the adhesive pool 54 communicate to each other via a groove 53. Also with such a configuration, even when the adhesive 60 is injected by a large amount into the through-hole 51, the surplus of the adhesive 60 can be extruded into the adhesive pool 54 through the groove 53 when the spacer 50 is pressed against the thin portion 20b. Thus, the inside of the through-hole 51 is easily filled with the adhesive 60, and the adhesive 60 is unlikely to be left in the direction of the thickness of the spacer 50. As a result, the thickness of the adhesive 60 can be further stabilized. Note that, the groove 53 may be omitted to directly communicate the through-hole 51 and the adhesive pool 54 to each other. Also in this case, a width of the adhesive pool 54 is smaller than the width of the through-hole 51, and hence the adhesive 60, which is viscous, remains unlikely to be extruded into the adhesive pool 54 until filling the inside of the through-hole 51. Thus, functions and advantages similar to those in the case where the groove 53 is formed are provided.

Figure 6:
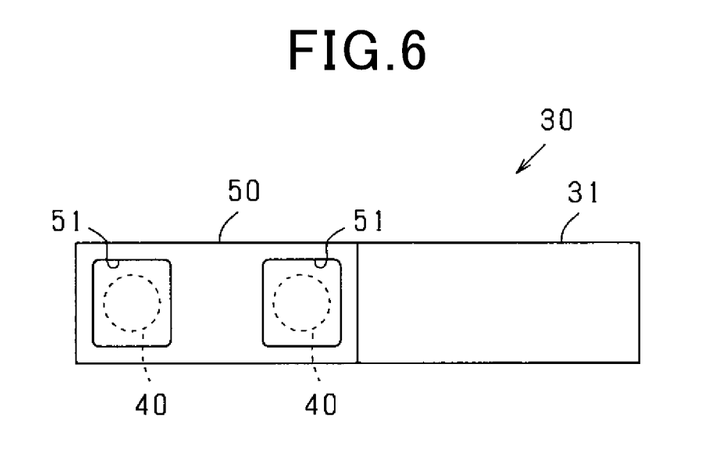
FIG. 6 is a bottom view illustrating still another modification of the flexible-board assembly.

As illustrated in FIG. 6, the flexible-board assembly 30 (that is, the sensor-device attachment structure 10) may include a plurality of sensor devices 40, and a plurality of through-holes 51 may be formed through the spacer 50 in its thickness direction at positions corresponding respectively to the plurality of sensor devices 40. With such a configuration, the thickness of the adhesive 60 can be secured in each of the corresponding ones of the plurality of through-holes 51 when the plurality of sensor devices 40 are attached to the thin portion 20b. In addition, the adhesive 60 is injected into the plurality of through-holes 51, and hence it can be said that the adhesive 60 is accurately positioned relative to each of the plurality of sensor devices 40 with use of the plurality of through-holes 51. In addition, since the flexible-board assembly 30 includes the plurality of sensor devices 40, it can be said that wire routing for the plurality of sensor devices 40 is collectively performed with use of the flexible board 31.

Figure 7:
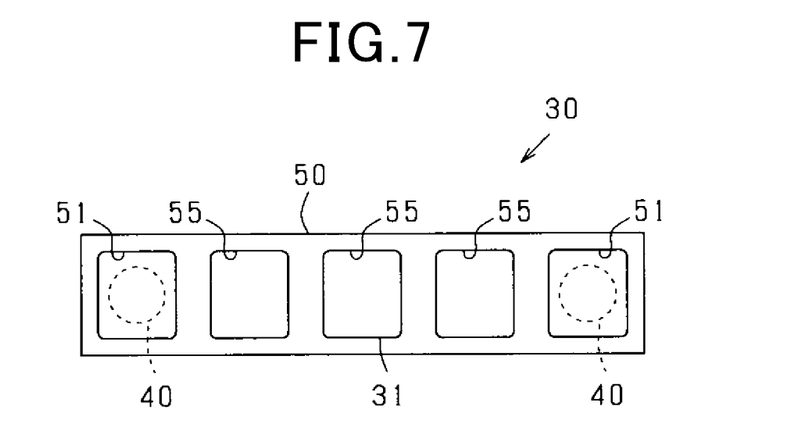
FIG. 7 is a bottom view illustrating yet another modification of the flexible-board assembly.

As illustrated in FIG. 7, other through-holes 55 may be formed through the spacer 50 in its thickness direction (that is, through portions) at positions not overlapping with the sensor devices 40. With such a configuration, when parts not corresponding to the sensor devices 40 among parts of the flexible board 31 are also bonded to the thin portion 20b, the thickness of the adhesive 60 can be secured also at these not-corresponding parts. In addition, when the parts not corresponding to the sensor devices 40 are not bonded to the thin portion 20b, a phenomenon in which the flexible board 31 peels from the thin portion 20b may occur. However, by bonding the parts not corresponding to the sensor devices 40 to the thin portion 20b, this phenomenon can be suppressed. With this, the peeled flexible board 31 can be suppressed from vibrating to affect detection by the sensor devices 40. In addition, in the spacer 50, the shape and a size of each of the through-holes 51 that are formed at the positions overlapping with the sensor devices 40, and a shape and a size of each of the other through-holes 55 that are formed at the positions not overlapping with the sensor devices 40 are the same as each other. In such a configuration, in the spacer 50, the through-holes 51 and 55 having the same shape and the same size are formed respectively at the position corresponding to the sensor devices 40 and the positions not corresponding to the sensor devices 40. Thus, common means for forming the through-holes can be adopted unlike a case where through-holes having different shapes and different sizes are formed at the positions corresponding to the sensor devices 40 and the positions not corresponding to the sensor devices 40. As a result, the through-holes 51 and 55 can be easily formed, and the shapes and the sizes of the through-holes 51 and 55 can be easily managed. In addition, when the thicknesses of the through-holes 51 and 55 are the same as each other, amounts of the adhesive 60 to be injected into the through-holes 51 and 55 can be equalized to each other, and hence the adhesive 60 can be injected by a common amount into each of the through-holes 51 and 55. In other words, productivity can be increased. Note that, the shape of the through-holes 51 and the shape of the through-holes 55 may be different from each other. In addition, the size of the through-holes 51 and the size of the through-holes 55 may be different from each other.

Figure 8:
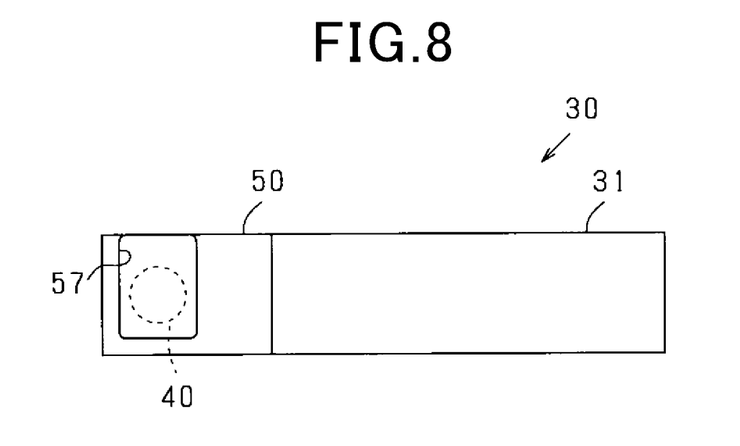
FIG. 8 is a bottom view illustrating yet another modification of the flexible-board assembly.

As illustrated in FIG. 8, in the spacer 50, a cutout 57 may be formed instead of the through-hole 51. The cutout 57 (that is, a through portion) is formed to open the spacer 50 in its thickness direction. The cutout 57 is formed at the position overlapping with the sensor device 40 among positions in the spacer 50, and communicates to the outside of the spacer 50. With such a configuration, functions and advantages similar to those of the configuration illustrated in FIG. 4 can be provided.

Figure 9:
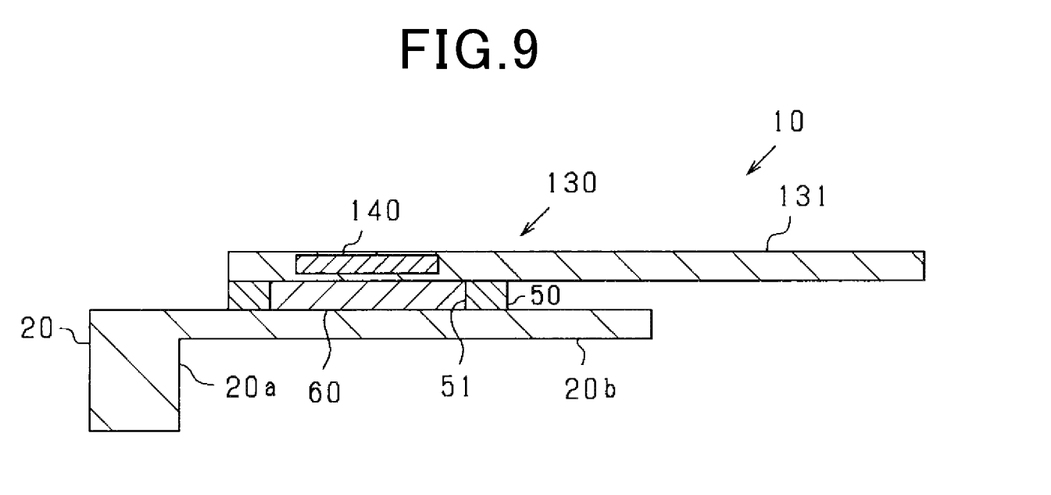
FIG. 9 is a cross-sectional view illustrating a modification of the sensor-device attachment structure.

As illustrated in FIG. 9, a flexible-board assembly 130 may include a flexible board 131 in which a sensor device 140 is formed as an electronic-circuit pattern. The sensor device 140 is formed, for example, of a resistor pattern and a conductor pattern, and is covered with a coverlay of the flexible board 131. In other words, the sensor device 140 is installed in the flexible board 131. With such a configuration, bonding or soldering of the sensor device 140 to the flexible board 131 can be omitted. Thus, the sensor device 140 can be easily installed into the flexible board 131. Further, the sensor device 140 can be formed as the electronic-circuit pattern together, for example, with a wiring pattern (such as the conductor pattern) in the flexible board 131. Still further, the sensor device 140 can be handled while installed in the flexible board 131, and hence the sensor device 140 can be easily handled.

Figure 10:
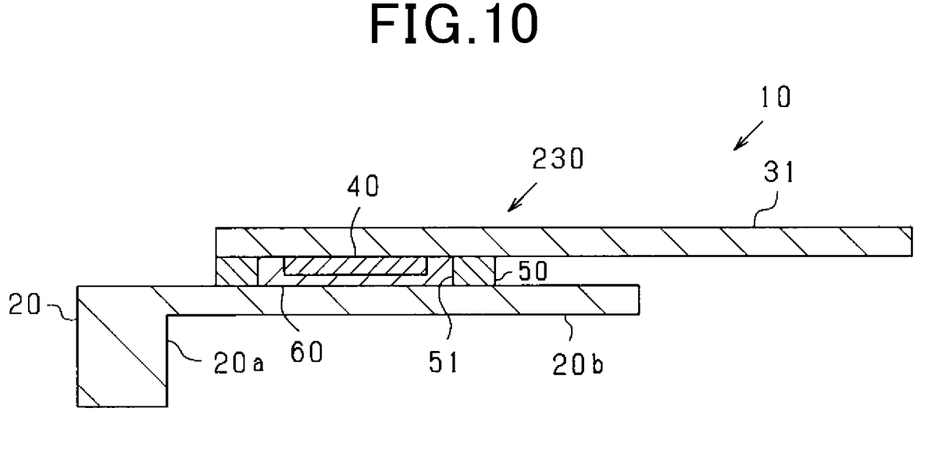
FIG. 10 is a cross-sectional view illustrating another modification of the sensor-device attachment structure.

As illustrated in FIG. 10, in a flexible-board assembly 230, the sensor device 40 may be accommodated in the through-hole 51 of the spacer 50. Also in this case, the spacer 50 is sandwiched between the thin portion 20b and the flexible board 31, and the through-hole 51 is formed at the position overlapping with the sensor device 40. In addition, the adhesive 60 is charged in the through-hole 51 so as to bond the thin portion 20b, the flexible board 31, and the sensor device 40 to each other.

Figure 11:
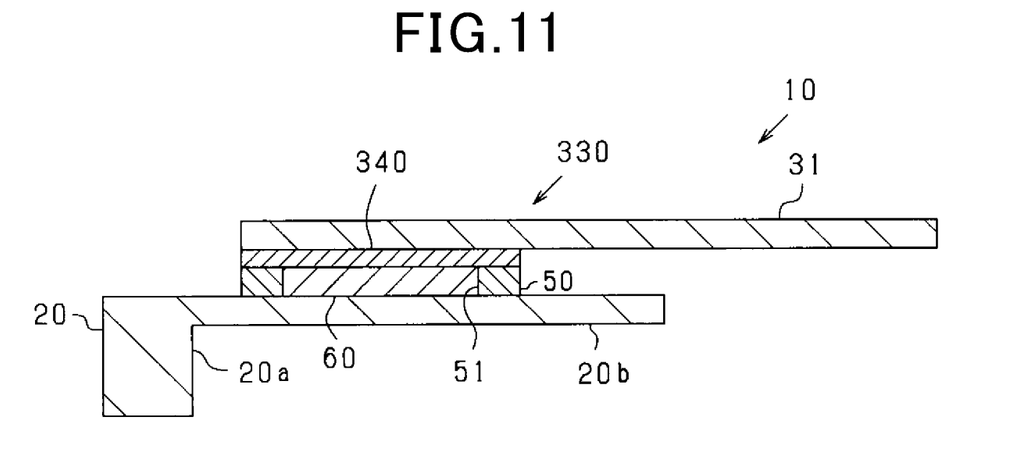
FIG. 11 is a cross-sectional view illustrating still another modification of the sensor-device attachment structure.

As illustrated in FIG. 11, in a flexible-board assembly 330, the spacer 50 may be sandwiched between the thin portion 20b and a sensor device 340. Specifically, there may be provided a sensor-device attachment structure including:
a thin portion that is thinner than other parts of a member;
a flexible board;
an at least one sensor device installed under the flexible board;
a spacer
that is formed into a shape of a film having a uniform thickness,
that is sandwiched between the thin portion and the at least one sensor device, and
that includes a through portion which is formed through the spacer in a thickness direction of the spacer at a position corresponding to a part of the at least one sensor device; and an adhesive
that is charged in the through portion and
that bonds the thin portion and the at least one sensor device to each other. In the spacer 50, the through-hole 51 is formed at a position overlapping with a part of the sensor device 340. The adhesive 60 bonds the thin portion 20b and the sensor device 340 to each other. In such a configuration, under a state in which the sensor device 340 is pressed against the thin portion 20b through intermediation of the spacer 50, a distance between the thin portion 20b and the sensor device 340 is equal to the thickness of the spacer 50. Thus, by injecting the adhesive 60 into the through-hole 51, and then by pressing the sensor device 340 against the thin portion 20b through intermediation of the spacer 50, the thickness of the adhesive 60 is equal to the thickness of the spacer 50. In other words, the thickness of the adhesive 60 can be secured owing to the thickness of the spacer 50. Thus, the thickness of the adhesive 60 can be secured also when the sensor device 340 installed under the flexible board 31 is attached to the thin portion 20b of the member 20. Further, it is easy to equalize the thickness of the film-like spacer 50, and hence the thickness of the adhesive 60 can be stabilized also in mass-produced products. Still further, it is easy to properly manage bonding strength and the distance between the thin portion 20b and the sensor device 340.

Figure 12:
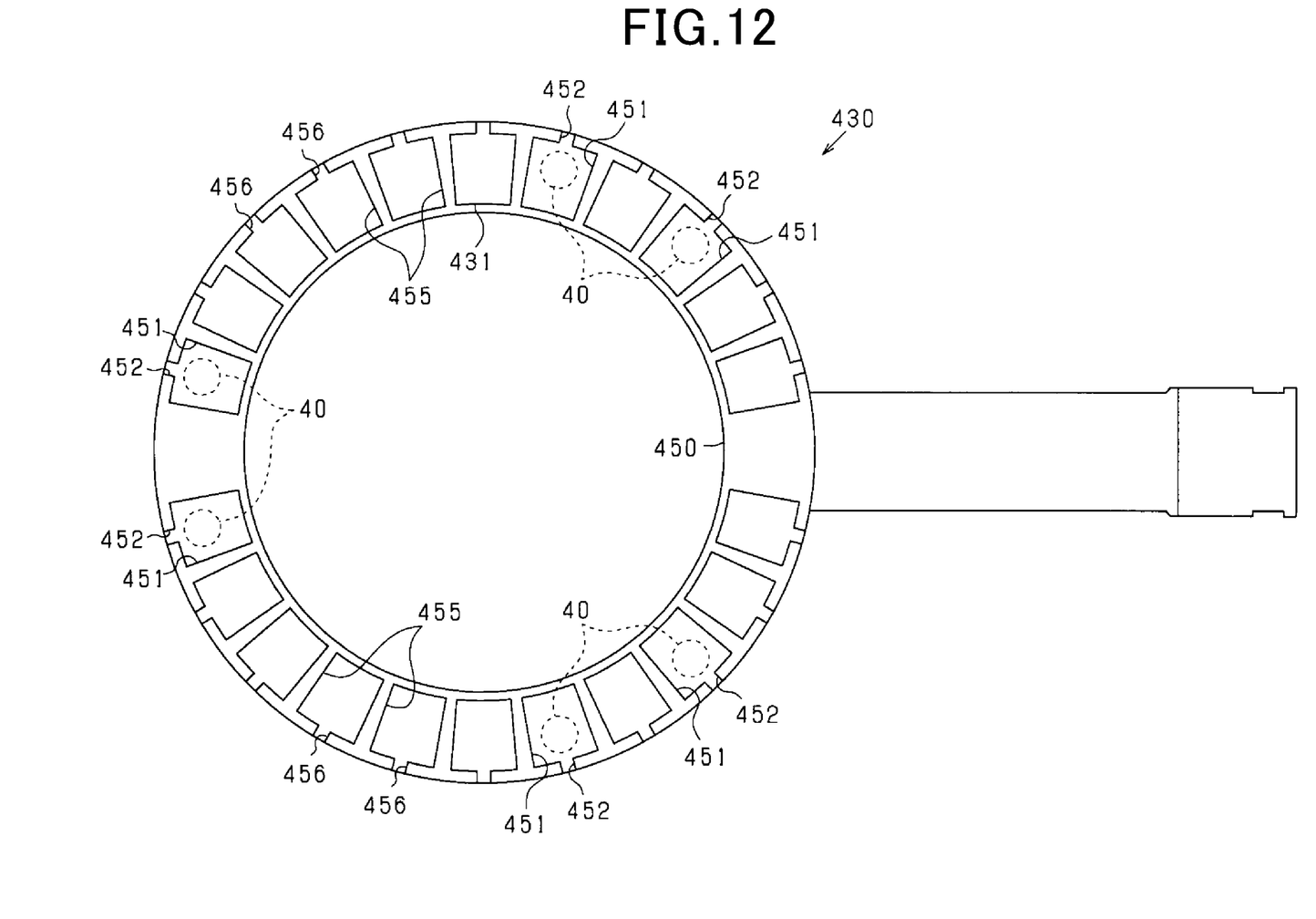
FIG. 12 is a bottom view illustrating yet another modification of the flexible-board assembly.

As illustrated in FIG. 12, the thin portion 20b may be formed into an annular shape, and a flexible board 431 and a spacer 450 may be formed annularly along the thin portion 20b. A flexible-board assembly 430 (that is, the sensor-device attachment structure 10) includes the plurality of sensor devices 40, and a plurality of through-holes 451 are formed through the spacer 450 in its thickness direction (that is, through portions) at positions corresponding respectively to the plurality of sensor devices 40. A plurality of other through-holes 455 are formed through the spacer 450 in its thickness direction (that is, through portions) at positions not overlapping with the plurality of sensor devices 40. With such a configuration, the thickness of the adhesive 60 can be secured at bonding parts when the flexible board 431 is bonded in conformity to the shape of the thin portion 20b. In addition, grooves 452 that communicate between an outside of the spacer 450 and the through-holes 451 are formed in the spacer 450, and grooves 456 that communicate the outside of the spacer 450 and the other through-holes 455 to each other are formed in the spacer 450.

The thin portion 20b of the member 20 need not necessarily be a flat-plate-like part, and may be a curved-plate-like part.

What is claimed is:

1. A sensor-device attachment structure comprising:
a thin portion that is thinner than other parts of a member;
a flexible board;
at least one sensor device installed to the flexible board;
a spacer
that is formed into a shape of a film having a uniform thickness,
that is sandwiched between the thin portion and the flexible board, and
that includes a through portion which is formed through the spacer in a thickness direction of the spacer at a position corresponding to the at least one sensor device; and
an adhesive that
is charged in the through portion, and
bonds the thin portion and the flexible board to each other.

2. The sensor-device attachment structure according to claim 1, wherein the spacer includes an other through portion which is formed through the spacer in the thickness direction of the spacer at a position out of correspondence to the at least one sensor device.

3. The sensor-device attachment structure according to claim 1,
wherein the thin portion is formed into an annular shape, and
wherein the flexible board and the spacer are formed annularly along the thin portion.

4. The sensor-device attachment structure according to claim 1, wherein, in the spacer, a shape and a size of the through portion which is formed at the position corresponding to the at least one sensor device, and a shape and a size of the other through portion which is formed at the position out of correspondence to the at least one sensor device are the same as each other.

5. The sensor-device attachment structure according to claim 1, wherein the at least one sensor device is formed as an electronic-circuit pattern on the flexible board.

6. The sensor-device attachment structure according to claim 1,
wherein the at least one sensor device includes a plurality of sensor devices, and
wherein the through portion of the spacer include a plurality of through portions which are formed through the spacer in the thickness direction of the spacer at positions corresponding respectively to the plurality of sensor devices.

7. The sensor-device attachment structure according to claim 1, wherein the through portion communicates to an outside of the spacer.

* * * * *